(12) United States Patent
Landis (10) Patent No.: US 8,734,145 B2
(45) Date of Patent: May 27, 2014

(54) MOLD FOR UV ASSISTED NANOIMPRINT LITHOGRAPHY AND METHODS FOR MAKING SUCH A MOLD

(75) Inventor: Stefan Landis, Voiron (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 269 days.

(21) Appl. No.: 13/013,566

(22) Filed: Jan. 25, 2011

(65) Prior Publication Data

US 2011/0186541 A1 Aug. 4, 2011

(51) Int. Cl.
  *B28B 1/00* (2006.01)
(52) U.S. Cl.
  USPC .......... 425/177; 425/174.2; 425/385; 216/45; 430/302
(58) Field of Classification Search
  USPC ............ 425/174.2, 177, 522, 538, 385, 395, 425/398; 216/11, 18, 39, 29; 430/324, 302, 430/320, 325
  See application file for complete search history.

(56) References Cited

U.S. PATENT DOCUMENTS

| 7,510,388 B2 * | 3/2009 | Terasaki et al. ............ 425/174.4 |
| 7,916,389 B2 * | 3/2011 | Suganuma ............... 359/486.01 |
| 2004/0086790 A1 | 5/2004 | Moriya et al. |
| 2009/0021153 A1 * | 1/2009 | Lee et al. ...................... 313/504 |
| 2009/0092791 A1 * | 4/2009 | Terasaki et al. ............... 428/156 |
| 2010/0015270 A1 | 1/2010 | Choi et al. |

FOREIGN PATENT DOCUMENTS

JP      2004 125874      4/2004

OTHER PUBLICATIONS

French Search Report dated Jul. 6, 2010 for French Patent Application No. 10 50570.

* cited by examiner

*Primary Examiner* — Lan Vinh
(74) *Attorney, Agent, or Firm* — Knobbe Martens Olson & Bear LLP (57) ABSTRACT

A mold for nanoimprint lithography assisted by a determined wavelength is disclosed. According to some aspects, a layer made from a first material including, on a first face, a layer made from a second rigid material in which n structured zones with micrometric or nanometric patterns (n≥1) are made, and, on the face opposite said first face, a layer made from a third rigid material in which n recesses are formed, opposite the n structured zones. The n recesses are filled with a fourth material to form n portions. The transmittance at the determined wavelength of the layer of third material is lower than the transmittance of any one of the n portions; and the transmittance of the layers of first, second, and third materials at the determined wavelength $\lambda_{det}$ is such that the transmission of a light with determined wavelength $\lambda_{det}$ through said layers is lower than the transmission of the light through any one of the n portions and the layers of first and second materials. According to some aspects, methods for making such a mold are disclosed.

13 Claims, 5 Drawing Sheets

MOLD FOR UV ASSISTED NANOIMPRINT LITHOGRAPHY AND METHODS FOR MAKING SUCH A MOLD

I. CROSS REFERENCE TO RELATED APPLICATIONS

This application claims the benefit of French Patent Application No. 1050570 filed on Jan. 28, 2010, the contents of which are incorporated herein by reference in their entirety.

II. TECHNICAL FIELD

The technical field relates to a mold intended to be used to perform UV-assisted NanoImprint Lithography (UV-NIL).

The technical field also relates to methods for making such a mold.

III. BACKGROUND OF THE INVENTION

UV-assisted nanoimprint lithography consists in duplicating patterns by pressing a mold, which is transparent at an usage wavelength situated in the UV range (i.e. a wavelength between 193 nm and 400 nm, preferably between 200 nm and 400 nm), in a UV photosensitive polymer film arranged in a substrate to be imprinted and applying UV radiation through said mold in order to photopolymerize the resin film.

The patterns reproduced in the polymer film are then etched in the substrate to be imprinted, underlying the polymer film.

It is called nanoimprinting because the duplicated patterns have a size (length, width and/or diameter) between a few nanometers and several hundred micrometers.

UV-assisted nanoimprinting is generally done using a technique called "step and repeat": a mold having an area of several cm² is put in contact with a resin film arranged on a substrate to be imprinted; the resin film is exposed to an usage wavelength situated in the UV range; the mold is then detached from the resin film and moved to another location of the substrate to be imprinted. These steps are repeated until the entire area of the substrate to be treated is imprinted.

The main drawback of this technique is that it is not possible to imprint two adjacent chips without leaving a separating distance between them. In the best of cases, this distance is several tens of micrometers, which constitutes a significant distance relative to the size of the chips and the size of the mold: there is therefore considerable lost space.

The main cause of this limitation comes from the fact that the mold usually made for carrying out the "step and repeat" technique is completely transparent to UV. As a result, during exposure to an usage wavelength situated in the UVs, the UVs modify the resin film present under the imprinted patterns, but also on the near periphery of the patterns (lateral diffusion).

This lateral diffusion of the light due to the transparency of the mold can be limited if the spaces situated between the patterns are covered by a light-absorbing layer. For example, the deposition of a layer of chrome on the face of a quartz mold comprising patterns will make it possible to locally eliminate the transparency of said mold. However, the deposition of said layer, done after the lithography and etching of the mold, is not simple to carry out and it is also difficult to very precisely define the boundary between the transparent zones and the absorbent zones of the mold. The presence of this light-absorbing layer also modifies the surface properties of the mold relative to the polymer film used during the nanoimprinting, which can cause new issues (appearance of flaws, wettability problem . . . ).

Another drawback of the UV-transparent molds is that they are generally rigid. Indeed, the molds generally used to perform UV-assisted nanoimprinting are made from quartz (quartz being transparent for wavelengths greater than 193 nm).

However, structuring using traditional lithography/etching methods of UV-transparent and rigid materials, and in particular quartz, becomes problematic when the patterns to be obtained have dimensions smaller than 100 nm.

Moreover, the more rigid a mold is, the more difficult it becomes to obtain homogenous contact (even contact) at all points between the mold and the resin film. It then becomes very difficult, or even impossible, to imprint patterns with satisfactory homogeneity. For example, a quartz mold has a rigidity such that the maximum area it is possible to imprint in a single step using such a mold is typically several cm².

In light of the aforementioned drawbacks, the inventor's goal was to design a mold for nanoimprint lithography assisted by a determined wavelength in which the necessary distance between two successive chips can be minimized.

Another of the inventor's goals is for the mold also to be able to comprise patterns with a nanometric size and/or to have an area greater than several cm².

IV. BRIEF DESCRIPTION OF THE INVENTION

These aims are achieved by a mold for nanoimprint lithography assisted by a determined wavelength $\lambda_{det}$, comprising a layer made from a first material including, on a first face, a layer made from a second material, that is rigid, and in which n structured zones with micrometric or nanometric patterns are made, n being an integer greater than or equal to 1, and, on the face opposite said first face, a layer made from a third material, which is rigid, in which n recesses are formed opposite the n structured zones, said n recesses being filled with a fourth material to form portions, the layer made from a third material having a thickness and a composition such that its transmittance to light with determined wavelength $\lambda_{det}$ is lower than the transmittance to light of the determined wavelength $\lambda_{det}$ of any one of the n portions, and the transmittances of the layers made of the first, second and third materials at the determined wavelength $\lambda_{det}$ being such that the transmission of a light with determined wavelength $\lambda_{det}$ through the layers of the first, second and third materials is less than the transmission of said light with determined wavelength $\lambda_{det}$ through any one of the n portions and the layers made from the first and second materials.

The fact that the layer made from the second material is rigid makes it possible to keep the geometry of the patterns during the use of the nanoimprint mold.

In the preceding and following, the expression "structured with micrometric or nanometric patterns", applied to a face or a layer, means that the face or layer in question comprises patterns whereof at least one dimension chosen from the length, width and diameter is less than 1000 micrometers and greater than 1 micrometer, in the case of micrometric patterns, and is greater than or equal to 1 nanometer and less than 1000 nanometers in the case of nanometric patterns.

In the context of the invention, the patterns can be in relief or recessed (hollowed). They can be dispersed homogenously in the n zones, and are preferably equidistant within a same zone. Advantageously, the patterns are identical (they have the same dimensions and the same shape). Advantageously, the n structured zones are identical.

In the preceding and following, the term "rigid", applied to a layer, means that that layer has a bending deformation (deflection) below a boundary value determined when a determined pressure is applied on the surface of said layer.

Likewise, in the preceding and following, the term "flexible", applied to a layer, means that said layer has a bending deformation greater than or equal to a boundary value determined when a determined pressure is applied on the surface of said layer.

To determine the boundary value, it is necessary to perform several simple calculations. For example, consider the case of a silicon and quartz mold having the following characteristics:

$E_{Si}$=130 Gpa $E_{SiO2}$=71.7 GPa $v_{Si}$=0.28 $v_{SiO2}$=0.16

$h_{Si}$=750 μm $h_{SiO2}$=6 mm where E is Young's modulus, v is the Poisson coefficient, and h is the height of the concerned layer.

The rigidity to bending of a piece is given by the following formula:

$$D = \frac{E \times h^3}{12 \times (1-v^2)}$$

For a square plate with side a, having a thickness h, the maximum deflection generated (in bending) w is more or less equal to:

$$w \approx \frac{P \times a^4}{D}$$

Therefore, if in the example above the pressure uniformly exerted on the mold is equal to $2 \cdot 10^5$ Pa and the side a of the plates has a value of $20 \cdot 10^{-3}$ m, then one has:

$w_{Si} \approx 500$ μm $w_{SiO2} \approx 25$ μm

Through these calculations, the deflection of each layer considered individually was obtained.

To obtain the boundary value making it possible to consider that a layer is flexible or rigid, it is necessary to compare the calculated deflection value and the surface roughness value (or topography) of the substrate one wishes to imprint using the mold. Indeed, when an imprint is done, it is necessary to have close contact (also called "even" contact) between the mold and the substrate to be imprinted; it is therefore necessary for the entire surface of the mold to be in direct contact with the entire surface of the substrate to be imprinted.

For example, a substrate formed by a silicon plate with a 200 mm diameter has a roughness of 50 μm (data provided by the supplier of the silicon plate). Thus, if the layer of the mold has a deflection greater than or equal to the roughness value of the substrate to be imprinted given by the manufacturer, i.e. 50 μm, this layer will be considered to be made from a material flexible relative to the substrate one wishes to imprint. On the other hand, if the value of the deflection of the layer of the mold is below the roughness value of the substrate to be imprinted, the layer will be considered a rigid material.

Thus, in our example, the silicon layer ($w_{Si} \approx 500$ μm) is considered to be flexible, while the quartz layer ($w_{SiO2}$=25 μm) is considered to be rigid.

Moreover, it is recalled that the transmittance of a material is the ratio of the energy transmitted through said material over the incident energy received by that material. For a given substance, with a defined thickness and wavelength, the transmittance is a constant.

Advantageously, the transmittance of the layer of the third material is less than or equal to about 0.2 and the transmittance of each of the n portions is greater than or equal to about 0.65. Preferably, the transmittance of the layer of third material is below about 0.1 and the transmittance of each of the n portions is greater than about 0.85.

Advantageously, the transmission of the light with determined wavelength $\lambda_{det}$ through the layers of first, second and third materials is less than or equal to about 20%, preferably less than about 10%, and the transmission of said light with determined wavelength $\lambda_{det}$ through any one of the n portions and the layers of first and second materials is greater than or equal to about 65%, preferably greater than about 85%.

Preferably, the transmittance of the layer made of the third material has a value less than or equal to ⅔ of the value of the transmittance of the material of the n portions. In optical lithography, it is considered that it is possible, with the current resins, to differentiate an exposed zone from a non-exposed zone if the contrast C is greater than or equal to about 20%, the contrast having the following formula:

$$C = \frac{I_{max} - I_{min}}{I_{max} + I_{min}}$$

where $I_{max}$ is the light intensity received in a zone where the transmittance is maximal ($T_{max}$) at a determined wavelength and $I_{min}$ is the light intensity received in a zone where the transmittance is minimal ($T_{min}$) at that determined wavelength.

Knowing that the transmittance is the ratio of the intensity transmitted through a material over the incident intensity (initial intensity $I_o$), we have:

$I_{max} = T_{max} \times I_o$ $I_{min} = T_{min} \times I_o$ and $C = \dfrac{T_{max} - T_{min}}{T_{max} + T_{min}}$ Ultimately, for a 20% contrast, we have $T_{min} \approx 0.66\, T_{max}$, i.e. about ⅔.

Advantageously, the n recesses have a depth equal to the thickness of the layer made from the third material.

According to a first alternative, the first material is a rigid material and the layer of second material is present only at the n structured zones. In this case, the first material, the second material, and possibly the third material are identical.

Advantageously, the n structured zones are made in the entire thickness of the layer of second material.

Advantageously, the layers of first and second material have a thickness less than or equal to 150 nm.

According to a second alternative, the first material is a flexible material and the layer of second material has a non-zero thickness outside the n structured zones.

Advantageously, the fourth material of the n portions is a flexible material.

Advantageously, the determined wavelength $\lambda_{det}$ is situated in the UV wavelength range, preferably between 193 nm and 400 nm. For example, if the mold is intended to be used to perform UV-assisted nanoimprinting at a wavelength between 193 nm and 400 nm, the layer of second material can be a silicon layer. It is then easy to carry out the structuring following nanometric patterns in such a layer, given that the lithography/nanometric etching of the silicon is mastered.

Advantageously, the layer made from the first material is silica or silicon nitride, the layer made from the second material is silica or silicon nitride, the layer of third material is silicon and the n portions of fourth material are made from polydimethylsiloxane (PDMS).

The invention also concerns a first method for making a mold as defined above for nanoimprint lithography assisted by a determined wavelength $\lambda_{det}$. This first method comprises the following steps:

a) providing an initial substrate;

b) structuring one face of said initial substrate, called front face, according to a pattern representing the negative imprint of the n structured zones one wishes to obtain in the layer of second material of the mold;

c) depositing a stack comprising three layers on the front face of the initial substrate, the first layer covering the relief formed in structuring step b) and forming the layer of second material of the mold, said first layer and the initial substrate being made from different materials, the second layer covering the first layer and forming the layer of first material of the mold, and the third layer covering the second layer and forming the layer of third material of the mold, d) structuring the third layer so as to obtain n recesses, the n recesses being opposite the n structured zones;

e) forming n portions of the mold by depositing a layer of fourth material on the third layer so as to cover the n recesses;

f) removing the initial substrate (13).

the third layer having a thickness and a composition such that the transmittance to light with determined wavelength $\lambda_{det}$ is less than the transmittance to light of determined wavelength $\lambda_{det}$ of any one of the n portions, and the transmittances of the first, second and third layers at the determined wavelength $\lambda_{det}$ being such that the transmission of light with determined wavelength $\lambda_{det}$ through the first, second and third layers is less than the transmission of said light with determined wavelength $\lambda_{det}$ through any one of the n portions and the first and second layers.

Advantageously, the transmittance of the third layer is less than or equal to about 0.2, preferably less than about 0.1, and the transmittance of each of the n portions is greater than or equal to about 0.65, preferably greater than about 0.85.

Advantageously, the transmission of the light with determined wavelength $\lambda_{det}$ through the first, second and third layers is less than or equal to about 20% and the transmission of this light with determined wavelength $\lambda_{det}$ through any one of the n portions and the first and second layers is greater than or equal to about 65%.

Advantageously, step b) comprises the following steps:

depositing a layer of photosensitive resin on a face of the initial substrate;

insulating the layer of photosensitive resin following an insulation pattern representing the negative imprint of the n structured zones one wishes to obtain in the first layer;

etching the insulated resin layer;

etching portions of the face of the initial substrate not covered with the layer of resin.

Advantageously, step d) comprises the following steps:

depositing a layer of photosensitive resin on the face of the third layer;

insulating the layer of photosensitive resin following an insulation pattern representing the positive imprint of the n recesses one wishes to obtain in the third layer;

etching the insulated resin layer;

etching portions of the face of the third layer not covered with the resin layer.

Step e) can be obtained by performing selective etching of the initial substrate or by machining the rear face of the initial substrate, then performing selective etching of the initial substrate.

The invention also relates to a second method for making a mold as described above, for nanoimprint lithography assisted by a determined wavelength $\lambda_{det}$. This second method comprises the following steps:

a) providing a stack comprising three layers, the first layer forming the layer of second material of the mold, the second layer covering the first layer and forming the layer of first material of the mold, and the third layer covering the second layer and forming the layer of third material of the mold, b) structuring the first layer of the stack so as to obtain the n structured zones;

c) making n recesses in the third layer of the stack, the n recesses being opposite the n structured zones;

d) forming the n portions of the mold by depositing a layer of fourth material on the third layer so as to cover the n recesses;

the third layer having a thickness and a composition such that its transmittance to light with determined wavelength $\lambda_{det}$ is less than the transmittance to light with determined wavelength $\lambda_{det}$ of any one of the n portions, and the transmittances of the first, second and third layers at the determined wavelengths $\lambda_{det}$ being such that the transmission of light with a determined wavelength $\lambda_{det}$ through the first, second and third layers is less than the transmission of that light with determined wavelength $\lambda_{det}$ through any one of the n portions (4) and the first and second layers.

Advantageously, the transmittance of the third layer is less than or equal to about 0.2, preferably less than about 0.1, and the transmittance of each of the n portions is greater than or equal to about 0.65, preferably greater than about 0.85.

Advantageously, the transmission of the light with determined wavelength $\lambda_{det}$ through the first, second and third layers is less than or equal to about 20% and the transmission of said light with determined wavelength $\lambda_{det}$ through any one of the n portions and the first and second layers is greater than or equal to about 65%.

Advantageously, step b) comprises the following steps:

depositing a layer of photosensitive resin on the first layer of the stack;

insulating the layer of photosensitive resin following an insulating pattern representing the micrometric or nanometric patterns arranged according to the n structured zones to be obtained;

etching the layer of insulated resin;

etching the portions of the face of the first layer not covered by the layer of resin.

Advantageously, step c) comprises the following steps:

depositing a layer of photosensitive resin on the third layer of the stack;

insulating the layer of photosensitive resin using an insulating pattern representing the n recesses to be obtained;

etching the layer of insulated resin;

etching the portions of the face of the third layer not covered by the layer of resin.

Advantageously, in the first and second methods above, the determined wavelength is a wavelength situated in the range of UV wavelengths, preferably between 193 and 400 nm.

Likewise, the n recesses in the first and second methods advantageously have a depth equal to the thickness of the third layer.

V. BRIEF DESCRIPTION OF THE DRAWINGS

The invention will be better understood and other advantages and particularities will appear upon reading the following description, provided as a non-limiting example, accompanied by the appended drawings, in which:

FIGS. 5a to 5h show the steps of the first method for making a mold according to the invention, FIGS. 6a to 6e illustrate the steps of the second method for making a mold according to the invention.

VI. DETAILED DESCRIPTION OF SPECIFIC EMBODIMENTS

In the following description, we will use the terms opaque and transparent.

A material is said to be opaque when it does not allow light to pass. In fact, it will be considered that a material having a thickness X is opaque when its transmittance is less than or equal to about 0.2.

A material is called transparent when it allows light to pass. In fact, it will be considered that a material having a thickness X is transparent when its transmittance is greater than or equal to 0.85; a material having a thickness X will be considered semi-transparent when its transmittance is greater than or equal to 0.65 and less than 0.85.

Figure 2:
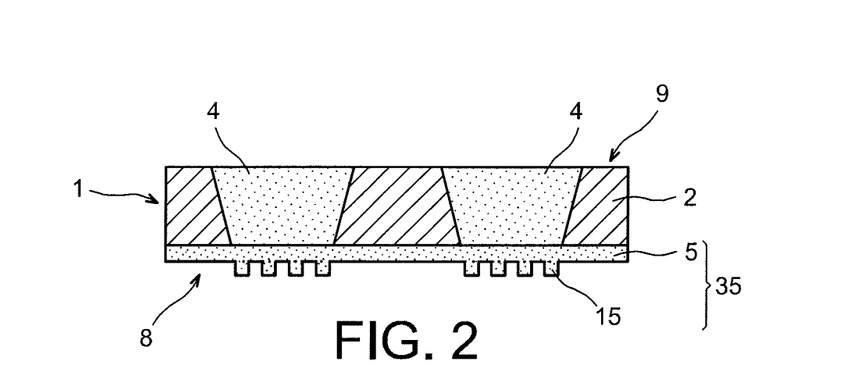
FIG. 2 shows a second example of a mold according to the invention.
Figure 3:
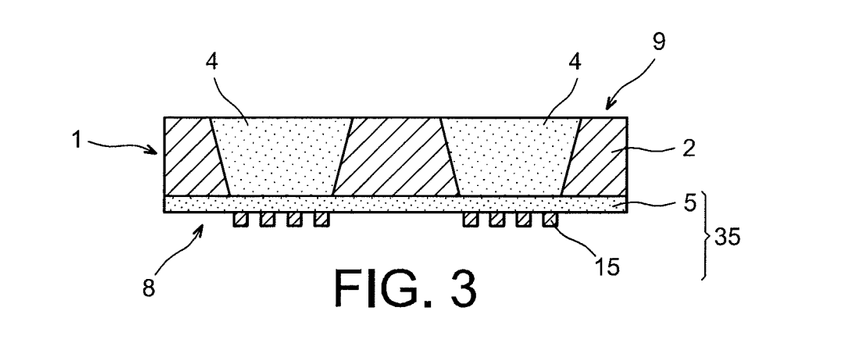
FIG. 3 shows a third example of a mold according to the invention.
Figure 4:
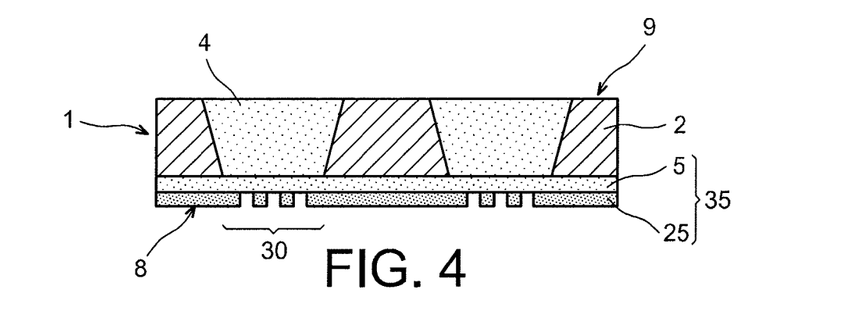
FIG. 4 shows a fourth example of a mold according to the invention.

As illustrated in any one of FIGS. 1 to 4, the mold 1 according to the invention comprises, on one of its faces (front face 8), n structured zones 30 following two- or three-dimensional micrometric or nanometric patterns 3, as well as n recesses or cavities on the opposite face (rear face 9), made in a rigid and opaque layer 2 and arranged overhanging the n structured zones 30, these n recesses being filled with a transparent material to form n portions 4. The patterns can be in relief (FIGS. 1 to 3) or recessed (hollowed) (FIG. 4).

In detail, the mold according to the invention includes a layer, rigid or flexible, in a first material 5, comprising, on one of its faces, a layer in a second rigid material 15, 25 and, on the face opposite the face including the layer of second material, a layer in a third rigid and opaque material 2.

In the rigid layer of second material 15, n structured zones 30 are made with micrometric or nanometric patterns 3, n being an integer greater than or equal to 1.

In the third layer of rigid and opaque material 2 at the determined wavelength $\lambda_{det}$, n recesses are made opposite the n structured zones; the n recesses are filled with a fourth transparent or semi-transparent material at the determined wavelength $\lambda_{det}$.

The material of the rigid layer 2 is chosen such that its transmittance is lower than the transmittance of the material of the n portions 4.

Moreover, the transmittances of the layer of first material, the layer of second material, and the layer of third material, at the determined wavelength $\lambda_{det}$, are chosen such that the transmission of a light with determined wavelength $\lambda_{det}$ through the first, second and third layers of materials is lower than the transmission of said light with determined wavelength $\lambda_{det}$ through one of the n portions, the layer of first material and the layer of second material.

Preferably, the material of the third material layer is chosen such that its transmittance is less than or equal to about 0.2, preferably less than about 0.1.

Preferably, the material filling the n portions has a transmittance greater than or equal to about 0.65, preferably greater than about 0.85.

The layer of third material 2 ensures the mechanical resistance of the mold. Preferably, it has a thickness between 100 micrometers and several millimeters.

It will be recalled that the determined wavelength corresponds to the wavelength at which the mold will subsequently be used to perform the nanoimprint.

The layers of first, second and/or third material can be made from different materials or a same material.

The first material can be flexible or rigid, while the second and third materials must be rigid.

Figure 1:
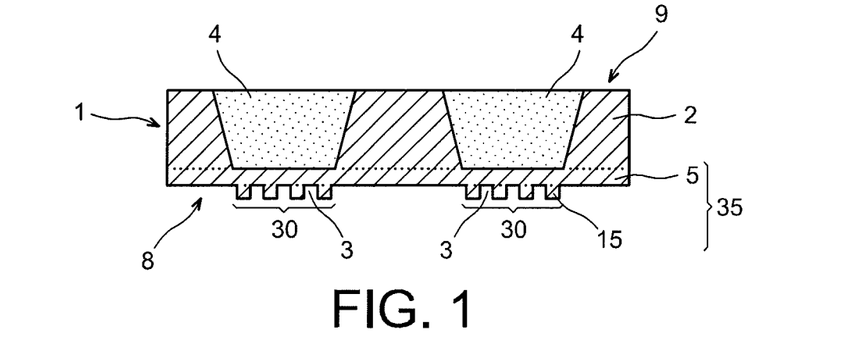
FIG. 1 shows a first example of a mold according to the invention.

According to a first alternative illustrated in FIG. 1, the layers of first 5, second 15 and third 2 materials are made from a same material. This is therefore a rigid material.

According to a second alternative illustrated in FIG. 2, the layers of first 5 and second 15 material are made from a same material, said material then being a rigid material and forms a single layer 35.

According to a third alternative illustrated in FIG. 3, the layers of first 5 and second 15 materials are made from two different materials; the layer of third material being different here from the first and second materials.

In FIGS. 1 to 3 described above, the patterns are in relief in the layer of second material (layer 15); more precisely, in FIGS. 1 to 3, the layer of second material is only present at the n structured zones (the layer of second material for example being completely etched between the n structured zones). But the patterns can also be made hollowed in the layer of second material, as shown in FIG. 4 (layer 25).

In the examples illustrated in FIGS. 1 to 4, the n recesses are made in the entire thickness of the layer of third material. It is, however, possible for the depth of the n recesses to be smaller than the thickness of the layer of third material.

The n recesses preferably have a base that becomes thinner as one comes closer to the n structured zones (funnel shape). This specific shape indeed makes it possible to concentrate the light towards the n structured zones. It should be noted that the funnel shape of the recesses is set by the etching, but it is entirely possible to have recesses whereof the side walls are perpendicular to their bases.

The layer of second material (layer 15 or 25) is made from a rigid material, which is preferably easy to microstructure or nanostructure (e.g. silicon).

The materials are chosen according to their rigidity or flexibility and according to the UV wavelength with which one wishes to use the imprinting mold and according to the thickness of each layer making up the mold. For example, for the layers of first, second, and third materials, it is possible to use silicon, silicon nitride, silicon carbide or a metal (Al, Ti . . . ). These layers will have a different transmittance depending on the material used and the thickness of the layer. The material intended to fill the n recesses can be chosen among silica, silicones, polycarbonate, polydimethylsiloxane . . . depending on the usage wavelength of the mold.

By forming n recesses in a layer made from rigid material 2 and filling these n recesses with a material whereof the transmittance at the wavelength used to carry out the imprinting is greater than that of the rigid material 2 of the layer, it is then possible to avoid the lateral dispersion of the light applied on the rear face of the mold and orient said light towards the n structured zones situated on the front face of the mold. Better light transmission is then obtained through the mold.

Moreover, if the material filling the n recesses is also a flexible material, it also makes it possible to deposit the flexible material very close to the structured zones present on the front face of the mold and thereby simply adjust the mechanical behavior of the mold. By thinning the thickness of the layer of rigid material 2 overhanging the zones comprising the patterns and filling the space thus created with a flexible material, it is in fact possible to standardize the stress exerted on the mold at these patterns and more quickly reach the final and uniform pressing state. It is thus possible to simultaneously resolve the issue related to the resolution of the patterns and that related to the uniformity of the pressing during printing.

We will now describe an embodiment of the mold according to the invention as illustrated in FIG. 2, i.e. a mold in which the layer of a first material 5 and the layer of a second material 15 are made from a same rigid material and form a single and same layer 35, having a transmittance greater than 0.65 at a determined wavelength, e.g. 350 nm, and including structured zones with nanometric patterns.

Figure 5A:
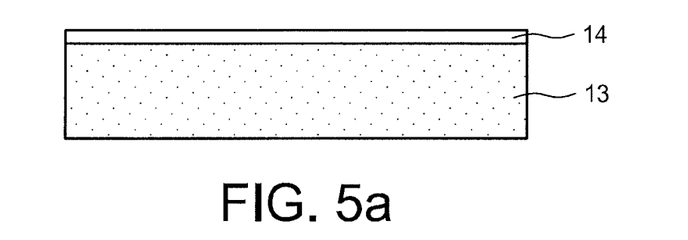
Figure 5B:
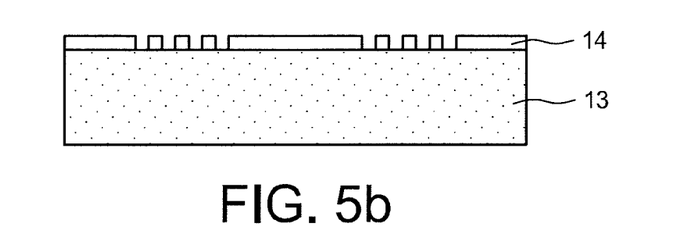
Figure 5C:
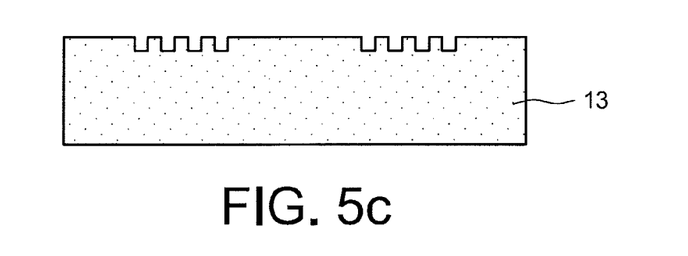

A structuring is first done of the front face of an initial substrate 13, e.g. by lithography (electronic, optical, EUV, X, FIB lithography . . . ) and by etching (reactive ion dry etching, ion machining, wet etching . . . ). To that end, a layer of resin 14 is deposited on a face of a silicon substrate 13 or any other material normally used in the micro and nano production methods well mastered for making microelectronics components (FIG. 5a), this layer of resin 14 is insulated following a pattern representing the reversed image (negative imprint) of the n zones that one wishes to obtain in the layer of second material of the future mold (FIG. 5b), the layer of insulated resin 14 and the portions not covered by the resin are etched (FIG. 5c). For example, if one wishes to obtain n zones in relief in the layer of second material of the future mold, these n zones are etched hollowed on the initial substrate. In our example, we chose to use a silicon substrate because the silicon makes it possible to perform etching with resolutions of less than 10 nm and aspect ratios (height/width) greater than 10.

A layer 350 of a rigid and transparent material in the 193-400 nm wavelength range is then deposited on the structured face of the initial substrate, for example a silicon oxide layer. The thickness of this deposited layer 350 is greater than the height of the patterns made in the initial substrate 13, because this layer 350 is intended to form both the layer of second material 15 and the layer of first material 5 of the mold (see FIG. 2). Moreover, the deposition must be done so as to suitably fill the relief made in the initial substrate 13.

Figure 5D:
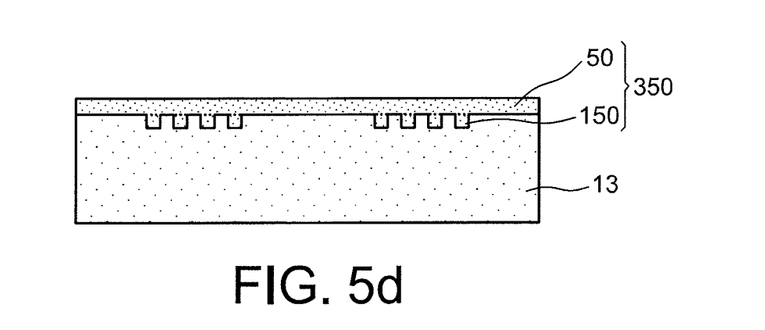

It should be noted that FIG. 5d shows a layer 150 and a layer 50, forming a single layer 350 (the layer 150 being intended to form the layer of second material 15 and the layer 50 being intended to form the layer of first material 5 of the mold) to illustrate the possibility of having a layer 15 and a layer 5 made from different materials.

Figure 5E:
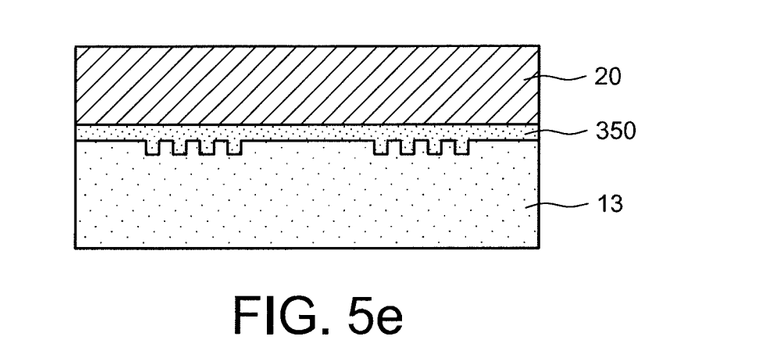
Figure 5F:
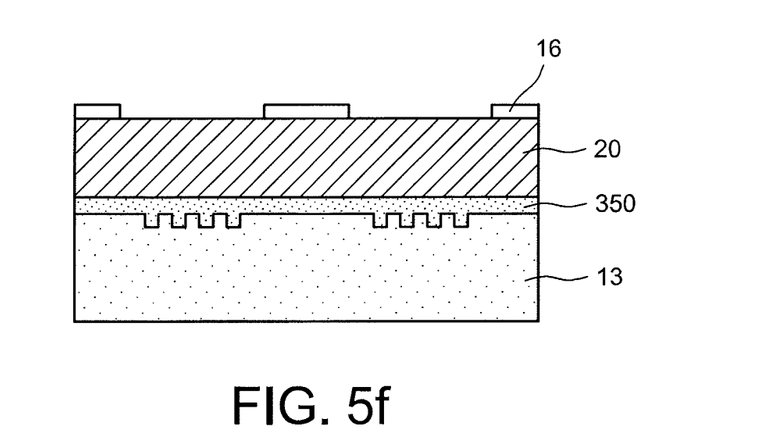

Then, a layer of a rigid and opaque material 20 is deposited on the layer of rigid and transparent material 350 (FIG. 5e). The layer of rigid material 20 can for example be a layer of silicon or silicon nitride, with a thickness of at least 100 micrometers, these materials having, for such a thickness, a transmittance below about 0.2 at a wavelength between 193 and 400 nm. N recesses are then formed in the layer of rigid and opaque material 20, opposite the n patterns situated in the layer 35, for example by lithography and etching by depositing a layer of resin 16, insulating it following a pattern and etching it (FIG. 5f), then by etching the underlying layer 20; the layer of third material 2 is then obtained including n recesses. Preferably, the recesses are etched in the entire thickness of the layer of rigid and opaque material 20.

Figure 5G:
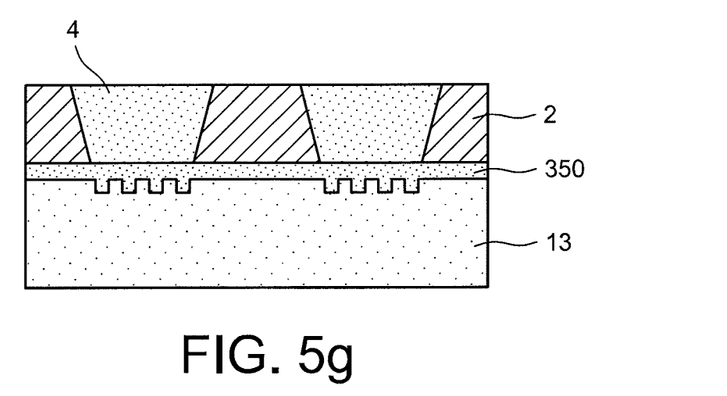

Then, a layer of a transparent material at the 193-400 nm wavelength, which is preferably flexible, is deposited in the n recesses and forms the n portions 4 (FIG. 5g). For example, this layer deposited in the n recesses is made from polydimethylsiloxane (PDMS). The advantage of PDMS is that its Young's modulus can be adjusted according to the proportion of the initiator rate contained in the preparation of the PDMS: the PDMS can therefore be more or less flexible.

It should be noted that, as explained before, the materials of the different layers are chosen according to their transmittance with a wavelength in the 193-400 nm range.

Figure 5H:
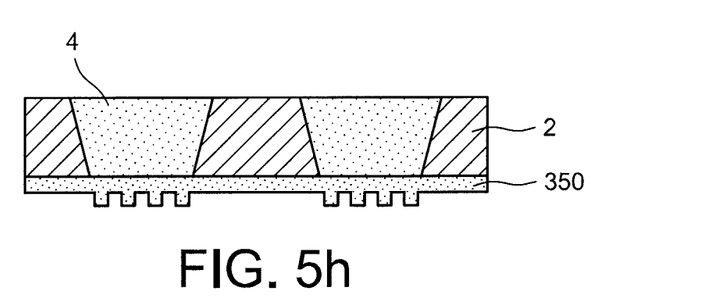

The initial substrate 13 is then removed (FIG. 5h). For example, the majority of the initial substrate 13 is removed by polishing or etching of its rear face and the rest of the initial substrate is removed by wet etching, e.g. by TMAH or KOH etching, in order to selectively etch the initial silicon substrate relative to the silicon oxide layer. It is advisable to choose a pair of materials for the initial substrate 13 and the layer of rigid material 350, in which the n structured zones are formed, that can undergo selective etching.

According to another embodiment, a mold is made according to the invention as shown in FIG. 3, i.e. a mold comprising a layer of a rigid and transparent material at the determined wavelength 5, e.g. transparent at 193-400 nm, including, on a first face, a layer of a rigid material 15, for example having a transmittance below about 0.2 or below about 0.65 at the determined wavelength, and in which n structured zones are made with nanometric patterns, and on a second face opposite the first face, a layer of rigid material 2, for example having a transmittance below about 0.2 at the determined wavelength, and including n recesses 4 filled with a material for example having a transmittance greater than about 0.65.

First, the structuring of a face of a SOI substrate 17 is done consisting of a stack of a silicon layer 150 having a thickness of 100 to 500 nm, an embedded silicon oxide layer 50 having a thickness of 100 nm to several micrometers, and a silicon layer 20 having a thickness of at least several hundred micrometers (i.e. greater than or equal to 100 micrometers).

Figure 6A:
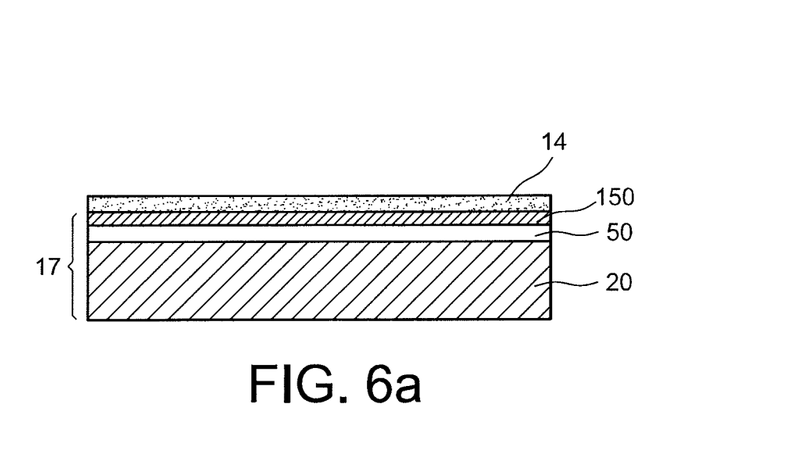
Figure 6B:
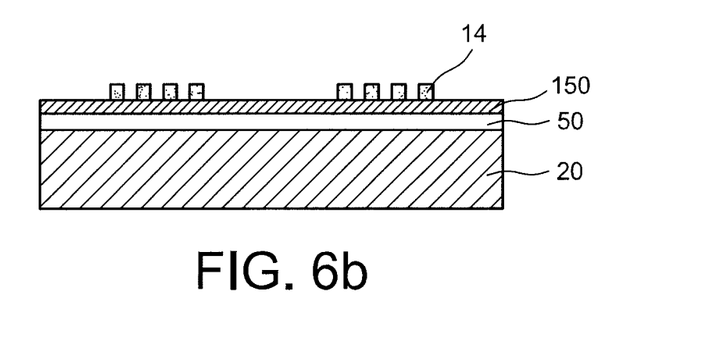
Figure 6C:
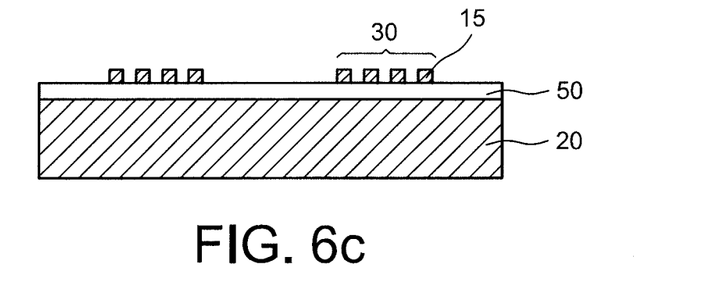

The structuring is obtained by depositing a layer of photosensitive resin 14 on the front face of the SOI substrate (on the silicon layer 150) (FIG. 6a), insulating the layer of resin following a pattern representing the n structured zones one wishes to obtain (FIG. 6b), and etching the layer of insulated resin and the portions not covered with the resin (FIG. 6c): the structured layer 15 is then obtained. The depth of the etched patterns can be less than or equal to the thickness of the silicon layer 150 of the SOI substrate. If it is equal to the thickness of the silicon layer 150, the silicon oxide layer 50 of the SOI substrate then serves as a stop layer for the etching.

Figure 6D:
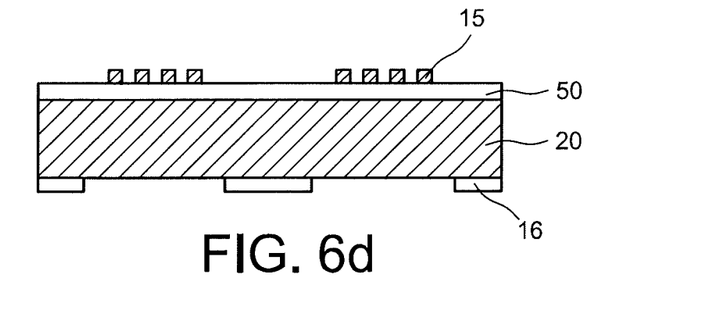

The rear face of the SOI substrate (silicon layer 20) is then structured so that opposite each structured zone 30 on the front face of the substrate, there is a corresponding recess on the rear face of the substrate: the structured layer 2 is then obtained. The n recesses can be obtained by depositing a layer of resin 16 on the rear face of the SOI substrate, insulating the layer of resin following a pattern representing the n recesses one wishes to obtain, then etching said layer of insulated resin and the portions not covered with the resin (FIG. 6d). The etching can potentially be done until the silicon oxide layer 60 is obtained, which then serves as a stop layer for the etching.

In this way, one is certain that the etching on the rear face of the substrate will not emerge on the front face on the patterns of the n structured zones.

Figure 6E:
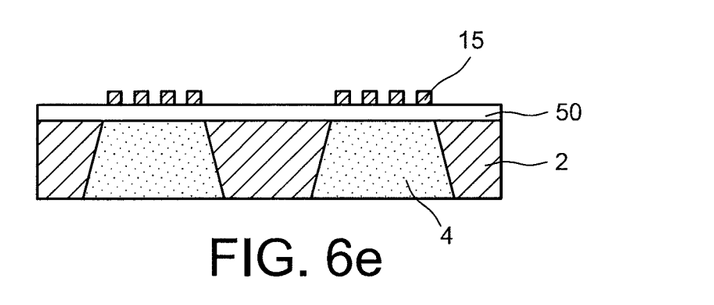

A layer is then deposited in a material having a transmittance greater than about 0.65 at the determined wavelength, which is preferably flexible, e.g. polydimethylsiloxane (PDMS), on the rear face of the SOI substrate so as to fill the n recesses (FIG. 6e).

The two production methods according to the invention make it possible to obtain molds having micrometric or nanometric patterns on the surface, while using simple lithography and etching methods, well known and mastered by those skilled in the art. In particular, the methods for making a mold according to the invention are compatible with the methods usually used in microelectronics and in the field of microtechnologies.

Moreover, although it was necessary in the prior art to etch substrates in rigid and transparent materials (i.e. having a transmittance greater than or equal to about 0.65) several hundred micrometers thick, sometimes made from very rigid materials of the silica or quartz type, which are very difficult to etch, in particular to obtain patterns with a size smaller than 100 nm, it is now possible to perform micrometric or nanometric structuring of the mold in a layer of a material that is easy to structure, such as a silicon layer, for example, without being limited by the fact that the material must be transparent or opaque (i.e. have a transmittance below about 0.2): it is then sufficient to deposit said layer comprising the n structured zones on the layer of rigid and opaque material comprising the n recesses. The production of the molds is thus considerably simplified and the production costs are, by the same token, lowered.

Moreover, since the lateral diffusion of the light is limited in the mold, the distance required between two adjacent structured zones can be minimized; it is therefore possible to place more structured zones on a same mold relative to the prior art.

It is also possible to imprint, on a same plate, two adjacent zones (zone we will call chip) with the same mold while reducing the distance between the two adjacent imprinted "chips." This amounts roughly to taking the structure as illustrated in the figures and moving it laterally to place it next to an identical preceding structure, the movement being able to be less than 1 micrometer.

It will be understood that other aspects will become readily apparent to those skilled in the art from the descriptions herein. One skilled in the art would understand that the present disclosure, the drawings and the descriptions in the present disclosure are to be regarded as illustrative in nature and not as restrictive.

The description set forth in connection with the appended drawings is intended as a description of various aspects of the present disclosure and is not intended to represent the only aspects in which the present disclosure may be practiced. Each aspect described in this disclosure is provided merely as an example or illustration of the present disclosure, and should not necessarily be construed as preferred or advantageous over other aspects. The description includes specific details for the purpose of providing a thorough understanding of the present disclosure. However, it will be apparent to those skilled in the art that the present disclosure may be practiced without these specific details.

The description of the disclosed aspects is provided to enable any person skilled in the art to make or use the present disclosure. Various modifications to these aspects will be readily apparent to those skilled in the art, and the generic principles defined herein may be applied to other aspects without departing from the spirit or scope of the disclosure.

What is claimed is:

1. A mold for nanoimprint lithography assisted by a determined wavelength $\lambda_{det}$, comprising an intermediate layer made from a first material and having two opposite faces, a lower layer, provided on a surface of one of the opposite faces of the intermediate layer, made from a second material, the second material formed as a rigid material, and in which n structured zones with micrometric or nanometric patterns are made, n being an integer greater than or equal to 1, and, an upper layer, provided on a surface of the other one of the opposite faces of the intermediate layer, made from a third material, the third material formed as a rigid material, in which n recesses are formed opposite the n structured zones of the lower layer, the n recesses being filled with a fourth material to form n portions;
    wherein the upper layer has a thickness and a composition such that its transmittance to light for a determined wavelength $\lambda_{det}$ is lower than the transmittance to light for the determined wavelength $\lambda_{det}$ of any one of the n portions, and
    wherein the transmittances of the upper, intermediate, and lower layers at the determined wavelength $\lambda_{det}$ are such that the transmission of a light for the determined wavelength $\lambda_{det}$ through the upper, intermediate, and lower layers is less than the transmission of the light for the determined wavelength $\lambda_{det}$ through any one of the n portions and the intermediate and lower layers.

2. The mold for assisted nanoimprint lithography according to claim 1, wherein the transmittance of the upper layer has a value less than or equal to ⅔ of the value of the transmittance of the fourth material of the n portions.

3. The mold for assisted nanoimprint lithography according to claim 1, wherein the transmission of the light for the determined wavelength $\lambda_{det}$ through the intermediate, lower, and upper layers less than or equal to about 20%, and the transmission of the light for the determined wavelength $\lambda_{det}$ through any one of the n portions and the intermediate and lower layers is greater than or equal to about 65%.

4. The mold for assisted nanoimprint lithography according to claim 1, wherein the n recesses have a depth equal to the thickness of the upper layer.

5. The mold for assisted nanoimprint lithography according to claim 1, wherein the n structured zones are formed in the entire thickness of the lower layer.

6. The mold for assisted nanoimprint lithography according to claim 1, wherein the first material is a flexible material, and wherein the lower layer has a non-zero thickness outside the n structured zones.

7. The mold for assisted nanoimprint lithography according to claim 1, wherein the fourth material is a flexible material.

8. The mold for assisted nanoimprint lithography according to claim 1, wherein the determined wavelength $\lambda_{det}$ is situated in the UV wavelength range.

9. The mold for assisted nanoimprint lithography according to claim 1, wherein the first material is silica or silicon nitride, the second material is silica or silicon nitride, the third material is silicon and the fourth material is polydimethylsiloxane (PDMS).

10. The mold for assisted nanoimprint lithography according to claim 1, wherein the transmittance of the upper layer is less than or equal to about 0.2, and the transmittance of each of the n portions is greater than or equal to about 0.65.

11. The mold for assisted nanoimprint lithography according to claim 10, wherein the transmittance of the upper layer is less than about 0.1 and the transmittance of each of the n portions is greater than about 0.85.

12. The mold for assisted nanoimprint lithography according to claim 1, wherein the first material is a rigid material and wherein the lower layer is present only at the n structured zones.

13. The mold for assisted nanoimprint lithography according to claim 12, wherein any two or more of the first material, the second material, and the third material are identical.

* * * * *